United States Patent [19]

Olsson et al.

[11] Patent Number: 4,785,454
[45] Date of Patent: Nov. 15, 1988

[54] STABILIZED CLEAVED-COUPLED CAVITY LASER

[75] Inventors: Nils A. Olsson, Berkeley Heights; Won-Tien Tsang, New Providence, both of N.J.

[73] Assignee: American Telephone and Telegraph Company, AT&T Bell Laboratories, Murray Hill, N.J.

[21] Appl. No.: 494,275

[22] Filed: May 13, 1983

[51] Int. Cl.[4] ............................................. H01S 3/10
[52] U.S. Cl. ...................................................... 372/26
[58] Field of Search ........................................... 372/26

[56] References Cited

U.S. PATENT DOCUMENTS

| | | | |
|---|---|---|---|
| 3,303,431 | 2/1967 | Fowler | 331/94.5 |
| 3,999,146 | 12/1976 | Lang et al. | 331/94.5 M |
| 4,101,845 | 7/1978 | Russer | 372/26 |
| 4,284,963 | 8/1981 | Allen, Jr. et al. | 331/94.5 H |
| 4,460,249 | 7/1984 | Vincent | 372/26 |

OTHER PUBLICATIONS

L. B. Allen et al., "Single Frequency Injection Laser Diodes for Integrated Optics and Fiber Optics Applications," *Proceedings of the Society of Photo-Optical Instrumentation Engineers*, vol. 157, 1978, pp. 110–117.

L. A. Coldren et al., "Monolithic Two-Section GaInAsP/InP Active-Optical-Resonator Devices Formed by Reactive Ion Etching," *Applied Physics Letters*, vol. 38, No. 5, Mar. 1, 1981, pp. 315–317.

K. J. Ebeling et al., "Generation of Single-Longitudinal-Mode Subnanosecond Light Pulses by High-Speed Current Modulation of Monolithic Two-Section Semiconductor Lasers," *Electronics Letters*, vol. 18, No. 21, Oct. 14, 1982, pp. 901–902.

M. B. Chang et al., "Amplification in Cleaved-Substrate Lasers," *IEEE Journal of Quantum Electronics*, vol. QE-16, No. 9, Sep. 1980, pp. 997–1001.

L. A. Coldren et al., "Etched Mirror and Groove-Coupled GaInAsP/InP Laser Devices for Integrated Optics," *IEEE Journal of Quantum Electronics*, vol. QE-18, No. 10, Oct. 1982, pp. 1679–1688.

W. F. Kosonocky et al., "GaAs Laser Amplifiers," *IEEE Journal of Quantum Electronics*, vol. QE-4, No. 4, Apr. 1968, pp. 125–131.

D. Fekete et al., "High-Speed Laser Modulation With Integrated Optical Injection," *Applied Physics Letters*, vol. 37, No. 11, Dec. 1, 1980, pp. 975–978.

F. K. Reinhart et al., "Electro-Optic Frequency and Polarization-Modulated Injection Laser," *Applied Physics Letters*, vol. 36, No. 12, June 15, 1980, pp. 954–957.

S. M. A. Hamdy et al., "Comparison of Modal Analysis and Equivalent Circuit Representation of E-Plane Arm of the Jerusalem Cross," *Electronics Letters*, vol. 18, No. 2, Jan. 21, 1982, pp. 94–95.

*Optical Devices & Fibers*, 1982, edited by T. Suematsu.

Primary Examiner—William L. Sikes
Assistant Examiner—Robert E. Wise
Attorney, Agent, or Firm—Richard D. Laumann; Wendy W. Koba

[57] ABSTRACT

A light transmitter comprising a cleaved-coupled cavity laser and stabilization means to maintain the laser in single longitudinal mode operation is described.

18 Claims, 3 Drawing Sheets

STABILIZED CLEAVED-COUPLED CAVITY LASER'

TECHNICAL FIELD

This invention relates generally to semiconductor lasers and particularly to such lasers that are stabilized to maintain a single frequency output and to light transmitters and communications systems comprising such lasers.

BACKGROUND OF THE INVENTION

Optical communications systems as presently contemplated use an optical fiber to optically couple a light source and a photodetector. To optimize the information carrying potential of such a system, a single frequency light source is desirable as such a source minimizes problems due to, for example, chromatic dispersion of the fiber. The term "single frequency" means the spectral distribution from a light source emitting radiation in a single longitudinal mode. Such a source is also desirable for a wavelength division multiplexing system. Such single frequency light sources have been developed and one, a cleaved-coupled cavity ($C^3$) laser, has demonstrated error-free unrepeatered transmission over a distance 119 km of optical fiber at a bit rate in excess of 400 Mbit/sec. The narrow spectral output of the cleaved-coupled cavity laser minimizes or even eliminates problems that might arise because of the dispersion characteristics of the fiber and makes such lasers ideal light sources for optical communications system that may be, for example, wavelength division multiplexing or multilevel frequency shift keying systems as well as high capacity.

The $C^3$ lasers comprise, for example, two semiconductor diode sections. In addition to being a single frequency light source, a cleaved-coupled cavity laser may also operate as a frequency tunable light source. Frequency tuning is obtained by varying the current through one of the diode sections, termed the modulator or control section, and, consequently, the lasing wavelength of the device can be electronically controlled to select one frequency from a set of discrete frequencies.

A light source installed in an optimally designed optical communications system should be capable of operating unattended for extended time periods while maintaining stable operation as the source ages and experiences environmental changes. As a result, high degrees of reliability and stability are demanded of the light source. The stability requirements are even more stringent for single frequency, i.e., single longitudinal mode, light sources of wavelength division multiplexing systems where, in addition to the required amplitude stability, the transmitter must operate with a high degree of frequency stability for satisfactory system operation. Other optical communications systems may also require a similarly high degree of frequency stability. Even for nonwavelength division multiplexing systems, single frequency operation is frequently desirable because of the dispersion characteristics of the optical fibers.

The desirability of a frequency stabilization scheme for a $C^3$ laser in some optical communications systems will be apparent from the following discussion. The $C^3$ laser used in the system has two optically coupled but electrically isolated diode sections. One section is typically operated above lasing threshold and the optical output from the laser is taken from this section. The other section, conveniently termed the "modulator" or "control" section, can operate either above or below lasing threshold. When the modulator section operates below the lasing threshold, the lasing wavelength is controlled, i.e., varied, by varying the current through the modulator section. The frequency tuning results from a shift in the Fabry-Perot modes of the modulator section caused by the refractive index change which results from a variation in the carrier density as the modulator current varies. When the modulator section is operated below threshold, it is apparent that wavelength stability will often be desirable in, for example, frequency shift keying and wavelength division multiplexing systems, so that the selected frequencies remain constant. Even above threshold, a stabilization scheme may be desirable as there may be incomplete clamping of the Fermi level and, consequently, there may be some frequency shifting after the current through the modulator section is further increased after the threshold current has been reached.

Although such cleaved-coupled cavity lasers have operated with a high degree of frequency stability, it would be desirable to have a transmitter that included a stabilization scheme that was able to compensate for, for example, environmental fluctuations or laser operating changes caused by normal aging of the laser diode sections, and to maintain the same single frequency output.

SUMMARY OF THE INVENTION

We have found that a light source comprising a cleaved-coupled cavity laser, said laser comprising a first section and a second section, means for measuring at least one characteristic of the intensity of the light output from one of said sections with respect to modulator current, and feedback means using said at least one characteristic of the light output with respect to the modulator current as a signal to adjust the modulator current to a desired value, produces a stable single frequency output. The utility of the stabilization scheme described resides in the discovery that the light output is nonlinear as a function of the modulator current. As one example of a nonlinearity, the light output exhibits local maxima, representing individual single longitudinal modes, as the modulator current is varied. In one preferred embodiment, the light output from the modulator section is measured. One characteristic that may be used by the feedback means for this nonlinearity is the first derivative of the output power with respect to the modulator current. This characteristic is maintained at a value of zero while the output power is maintained at the local maxima. Communications systems using a frequency stabilized cleaved-coupled cavity laser are also described.

DETAILED DESCRIPTION

Figure 1:
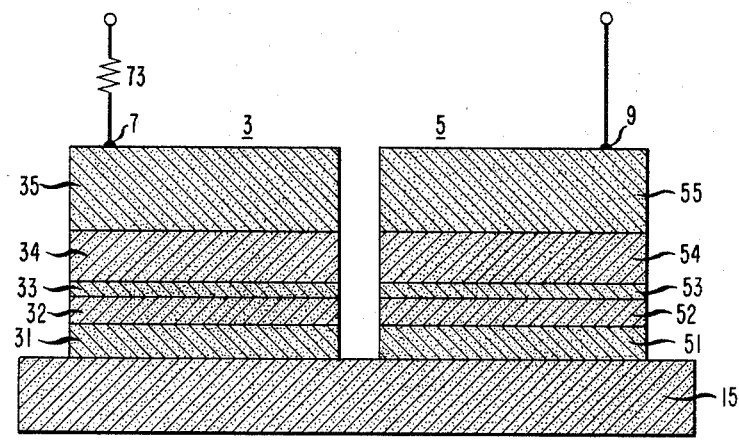
FIG. 1 is a sectional view of a cleaved-coupled cavity laser through the active layer of the laser.

FIG. 1 is a cross-sectional view of a cleaved-coupled cavity laser through the active layer of the device. For reasons of clarity, the elements of the cleaved-coupled cavity laser are not drawn to scale.

Section 3 comprises a first layer 31, a first cladding layer 32, active layer 33, second cladding layer 34, and layer 35. Section 5 comprises first layer 51, first cladding layer 52, active layer 53, second cladding layer 54, and layer 55. Further, there is a built-in p-n junction in the active layer in each section. The active layer, i.e., the region in which electron-hole recombination occurs, has a first bandgap energy and a first refractive index. The active layers have a width through which current is injected that is less than 20 $\mu$m to prevent multifilament lasing, i.e., the active layers have a width less than 20 $\mu$m. The cladding layers have a second bandgap energy which is greater than the first bandgap energy and a second refractive index which is less than the first refractive index. The cladding layers thus provide both carrier and optical confinement for these sections which are index guided. Both section 3 and 5 are disposed on substrate 15. Sections 3 and 5 are electrically contacted by electrode 7 and 9, respectively, and there is further a circuit element, such as variable resistance 73, which permits the current through section 3 to be adjusted relative to the current of section 5. Variable resistance 73 thus provides means for adjusting the refractive index of the first and second sections relative to each other. The substrate 15 forms a common electrical contact to sections 3 and 5. The electrical contacts to sections 3 and 5 may also be used to adjust the current through the two sections. Although the active layers are depicted as being closer to the substrate than to the top surface, they may also be positioned the latter way, i.e., closer to the top surface. All the layers are epitaxially grown and are approximately lattice matched to each other. A variable resistance may also be connected to section 5. Further, laser heterostructures other than the one described may also be used and other means for adjusting the refractive index of the first and second sections relative to each other may also be used. Other index guided structures may also be used. Additionally, the layer structures in sections 3 and 5 may differ.

The cavities are mutually optically coupled to each other through cleaved mirror surfaces and the active stripes are aligned with respect to each other, i.e., the stripes are positioned essentially co-linearly with respect to each other, and separated by a relatively small distance, typically less than 10 $\mu$m, but greater than the carrier tunneling distance, thus providing electrical isolation between the sections. This, i.e., the carrier tunneling distance, is approximately 200 Angstroms for electrons in InGaAsP.

The sections should be electrically isolated from each other, i.e., they should be capable of being electrically biased relative to each other. This facilitates separate control of the carrier concentrations in the two sections.

The compositions of the layers and substrate are not critical, although the layers and the substrate should be at least approximately lattice matched to each other, and may be selected from the group consisting of Group III-V and Group II-VI compound semiconductors. These compositions, for example, InGaAsP, permit the wavelength of the emitted radiation to be in the wavelength range between approximately 1.1 $\mu$m and approximately 1.7 $\mu$m. This is the wavelength range that is presently of greatest interest for optical communications.

Embodiments other than the one described are contemplated. For example, the device may comprise a first cavity section comprising a laser and a second cavity section. Both sections are optically coupled in both directions by spaced cleaved surfaces. The device further comprises means for changing the refractive index of at least one section so that the ratio of the most intense longitudinal mode to suppressed longitudinal modes is at least 50 when said device is CW operated. The means for changing refractive index comprises, for example, means for adjusting the current injected or means for adjusting the bias. The second cavity section need not be a laser.

An exemplary method for forming devices comprising coupled cavities from a unitary structure according to this invention will be briefly described. A standard semiconductor laser wafer having a plurality of active stripes has, on one surface, a plurality of gold pads which are formed by, for example, electroplating. The precise structures of the active stripes and adjacent layers are not critical and they may be buried heterostructures, buried crescent heterostructures, or yet other types. The desired layers may be grown on the substrate by growth techniques, such as molecular beam or liquid phase epitaxy, that are well known to those skilled in the art. However, the isolated thick gold pads should preferably be approximately the same size as the standard diode and are electroplated onto the wafer side having the epitaxial layers, if the diode is CW bonded epitaxial layer (epilayer) side down, or onto the substrate side, if the diode is bonded epilayer side up. Other deposition techniques, such as evaporation, may also be used. Metals other than gold may be used if they adhere to the semiconductor and may be plastically deformed. Standard and well-known cleaving procedures are now applied. At one position, the bars separate from each other as these positions are not contacted by the gold pads. However, at the other positions, the presence of the gold pads holds the adjacent cleaved bars together. The lengths are not critical and can be selected as desired. The individual pairs of diodes, which are still held together by the gold pads, are now separated from each other by sawing or scribing. The resulting structure of a single pair of laser diode sections has two precisely self-aligned and extremely closely optically coupled Fabry-Perot cavities. The mirrors of the cavities are formed by the cleaved surfaces.

One section may be termed the "laser section" and the second section the "modulator section".

A typical separation of the coupled cavities is approximately 1 $\mu$m. If a larger separation is desired, it can be easily obtained by, for example, moving the two Fabry-Perot diodes with respect to each other using the gold pad as the hinge. The precise separation is not critical but it should be greater than the carrier tunneling distance and less than approximately 10 $\mu$m. Of course, the last movement should place the mirror faces parallel or approximately parallel to each other so that the active stripes are aligned with respect to each other. The mirror faces need not be precisely parallel to each other as the angular distribution of the emitted radiation is sufficiently broad to optically couple the cavities. However, the faces should not contact each other, as electrical isolation between the sections is desired. Further, the Fabry-Perot diodes may be slightly twisted with respect to each other with the active stripes forming the twist axis. This twist has a transverse mode filtering effect, i.e., certain transverse modes can be suppressed.

To complete the fabrication of the device, the two Fabry-Perot diodes hinged together by the gold pad are bonded, using, e.g., indium, simultaneously epilayer side down on a heat sink, such as gold plated copper. Standard CW bonding procedures may be employed. Separate electrical connections are made to each diode on the substrate side. Of course, if the gold pads are on the substrate side, the Fabry-Perot diodes are bonded simultaneously substrate side down, respectively, and the separate electrical connections are made on the epilayer side.

Use of the gold bonding pads is not essential. For example, the laser diode sections may be formed by cleaving a standard wafer without bonding pads and then positioning the diodes with respect to each other on the heat sink and bonding. However, the use of the gold pads facilitates relatively accurate positioning of the active stripes with respect to each other.

The stabilization scheme according to this invention is intended primarily for operation with the modulator section operating below the lasing threshold. However, the stabilization scheme may also be used with the modulator section operating above lasing threshold because there may be some frequency tuning above threshold due to incomplete pinning of the Fermi level. The stabilization scheme relies on the discovery of nonlinearities, for example, local maxima, in the output power of the laser versus the modulator current.

Figure 2:
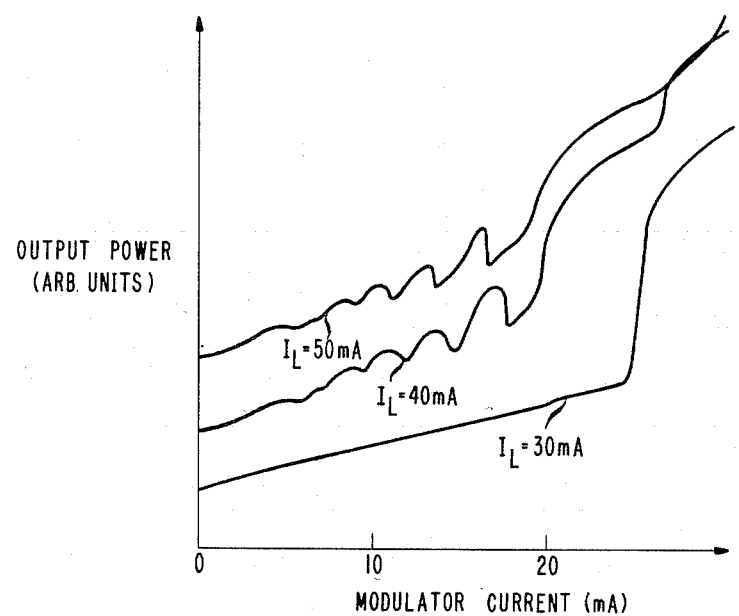
FIG. 2 plots the modulator current horizontally in units of mA versus the output power vertically in arbitrary units for a cleaved-coupled cavity laser.

FIG. 2 plots the current through the modulator section, horizontally, in units of mA versus the light output, vertically, in arbitrary units from a InGaAsP buried crescent cleaved-coupled cavity laser. The light output is from the modulator section. The different curves represent different currents through the laser section with the current being indicated for each curve. The bottom curve, 30 mA through the laser section, represents a current below lasing threshold. As is apparent, the relationship is nonlinear and there are bumps, i.e., local maxima, in the light output power versus current curves which result from wavelength, i.e., frequency, tuning of the cleaved-coupled cavity laser as the modulator current is varied. It was found that the peak of each bump corresponds to the optimum modulator current for each selected longitudinal mode. The optimum modulator current is defined as the current that maximizes the ratio of the most intense longitudinal mode to the second most intense longitudinal mode. It should also be noted that as the current through the laser section varies, the magnitude of the modulator current varies to maintain laser operation at the desired longitudinal mode.

That the local maxima in the light output power versus current curves actually correspond to the optimum modulator current was found by measuring the longitudinal mode discrimination ratio as a function of the first derivative of the output power with respect to the modulator current. The longitudinal mode discrimination ratio is defined here as the ratio of the intensity of the dominant, i.e., most intense, mode to that of the next most intense mode. It was determined that the highest mode ratio coincides with a zero derivative.

Figure 3:
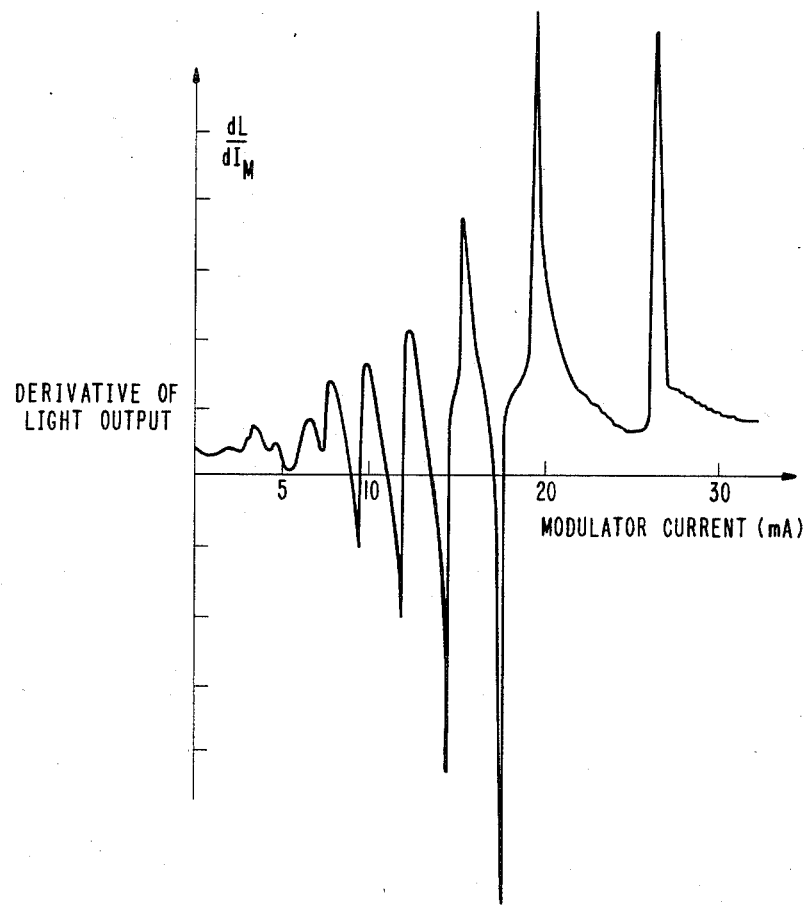
FIG. 3 plots the modulator current horizontally in units of mA versus the derivative of the light output vertically, for a cleaved-coupled cavity laser.

At the optimum modulator current, the curve of output power versus modulator current goes through a local maximum. Therefore, feedback means that detect the local maxima may be constructed to stabilize the output. For the top two curves depicted, the first derivative of the light output power with respect to the modulator current is zero for the optimum modulator current and it has opposite signs on each side of the zero point. FIG. 3 shows the measured first derivative of the output power with respect to the modulator current as a function of the modulator current for a current of 40 mA through the first, i.e., laser, diode section. Therefore, feedback means using the first derivative of the light output with respect to the modulator current as a signal may be constructed to stabilize the output with respect to frequency by maintaining the first derivative at a value of zero and the output power at a local maximum. That is, the characteristic of the light output used by the feedback means is the first derivative of the light output with respect to the modulator current.

Figure 4:
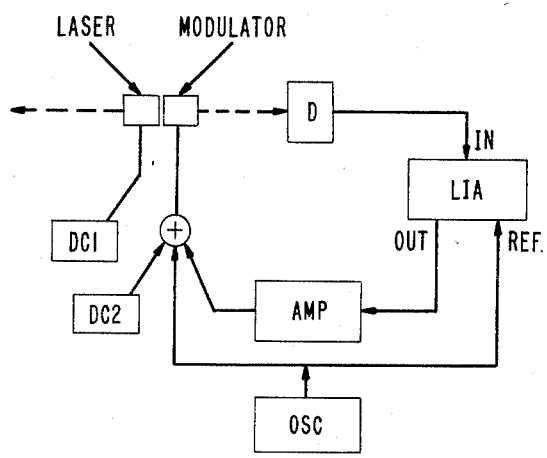
FIG. 4 is a schematic representation of a light transmitter unit according to this invention.

An optical transmitter device comprising a cleaved-coupled cavity laser and stabilization means to maintain single frequency operation is schematically represented in FIG. 4. The device comprises a cleaved-coupled cavity laser having laser and modulator sections indicated as LASER and MODULATOR. The device further comprises direct current sources, DC1 and DC2, to the laser and modulator sections, respectively. Light is emitted from both the laser and modulator sections as indicated by the arrows. A photodetector D detects the light output from the modulator section and generates a signal which goes to a lock-in amplifier LIA. An oscillator, OSC, supplies a current to both the LIA and the modulator section. An output signal from the LIA is amplified by an amplifier, AMP, and applied to the modulator section. Operation and construction of individual components will be known and understood by those skilled in the art and need not be discussed in detail.

The operation of the device is as follows. A small AC current, approximately 50 microamps, at a frequency of 22 KHz from the oscillator, is applied to the modulator section of the laser. The output power from the modulator section is detected by the photodetector D and the signal from the photodetector goes to the lock-in amplifier LIA. The first derivative of the light output with respect to the current through the modulator section is obtained by detecting the 22 KHz component of the output power with the lock-in amplifier. The means for measuring at least one characteristic comprises the photodetector and lock-in amplifier. After amplification of this signal by the amplifier, the output is fed to the modulator section and the feedback loop is closed. The feedback means comprises the lock-in amplifier, amplifier and oscillator. The loop time constant is approximately 1 msec.

Figure 5:
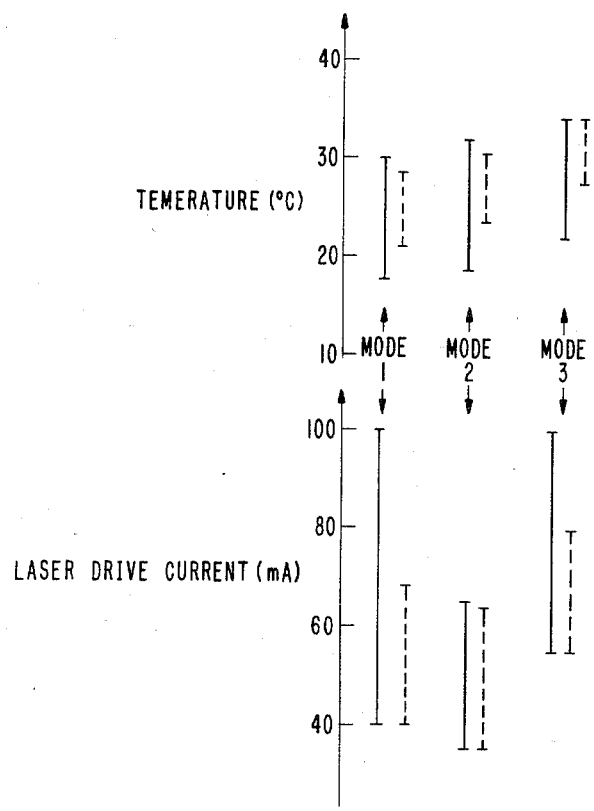
FIG. 5 shows stable single mode operating ranges for a cleaved-coupled cavity laser without stabilization (dotted lines) and with stabilization (dashed lines) for variations in both temperature and laser diode drive current.

The feedback means was evaluated by measuring the range of single mode operation with respect to both temperature and current through the laser section. The results are demonstrated in FIG. 5 where the operating regions are shown as solid (with feedback) and dotted (without feedback) bars. The measurements were made for three different modes at modulator currents of 5 mA, 8 mA, and 11 mA. As can be seen, an approximately 100 percent improvement is obtained in the range over which the laser operates in the single longitudinal mode with respect to both temperature and laser current. The improvement with respect to laser current may be even higher as the laser was not operated at currents greater than 100 mA to avoid possible damage to the laser.

Other characteristics of the light output versus modulator current curve may be used to maintain the output at the desired spectral value. For example, the first derivative may not exist as the light output power may decrease very abruptly, i.e., essentially a step function decrease in intensity, from the local maxima as the modulator current is increased. Additionally, for some modes of operation and for some lasers, it may be desired to have a nonzero value for the first derivative. For these situations, different characteristics may be used by the feedback means. Nonzero first derivative values may also be used for some purposes. That is, the device may operate on the slopes of the bumps of the output power versus modulator current curve. It will also be readily appreciated that a portion of the light output from the laser section may be used rather than the output from the modulator section. It will also be appreciated that the system described maintains the desired spectral output as the current through the laser section is varied.

The stabilized cleaved-coupled cavity laser is useful in optical communications systems. Such a system comprises a stabilized cleaved-coupled cavity laser, a photodetector and an optical fiber which optically couples the laser and photodetector. The details of suitable photodetectors and fibers are readily known to those skilled in the art and need not be discussed in detail.

Modifications of the embodiments described will be readily thought of by those skilled in the art. For example, continuous frequency modulation may be obtained by superimposing a small modulating current upon the controlled current through the modulator sections. The means for superimposing the modulating current will be readily known to those skilled in the art. Since the modulator section is operating below threshold, the effective carrier density modulation is obtained with a small modulating current and produces a large frequency excursion for a small variation in current. Additionally, there is only a small amount of unwanted intensity modulation when the modulating current is superimposed on the modulator current that, for example, produces a local maxima in the light output versus modulator current curve.

What is claimed is:

1. A light transmitter comprising a cleaved-coupled cavity laser comprising a laser section and a modulator section, means for measuring at least one characteristic of the light output from one of said sections with respect to the current through the modulator section; and feedback means using said at least one characteristic to maintain said output at a desired spectral value.

2. A light transmitter as recited in claim 1 in which said one of said sections comprises said modulator section.

3. A light transmitter as recited in claim 2 in which said at least one characteristic comprises the first derivative of the light output intensity with respect to the current through the modulator section.

4. A light transmitter as recited in claim 3 in which said feedback means maintains said first derivative at a value of approximately zero.

5. A light transmitter as recited in claim 4 in which said feedback means maintains said value of approximately zero at a local maximum in the light output power versus modulator current characteristic curve.

6. A light transmitter as recited in claim 5 further comprising means for superimposing a modulator current through said modulator section.

7. An optical communications system comprising a light transmitter as recited in claim 6, a photodetector, and an optical fiber, said fiber optically coupling said light transmitter and said photodetector.

8. An optical communications system comprising a light transmitter as recited in claim 5, a photodetector, and an optical fiber, said fiber optically coupling said light transmitter and said photodetector.

9. An optical communications system comprising a light transmitter as recited in claim 4, a photodetector, and an optical fiber, said fiber optically coupling said light transmitter and said photodetector.

10. An optical communications system comprising a light transmitter as recited in claim 3, a photodetector, and an optical fiber, said fiber optically coupling said light transmitter and said photodetector.

11. A light transmitter as recited in claim 2 in which said at least one characteristic comprises the light output intensity.

12. An optical communications system comprising a light transmitter as recited in claim 11, a photodetector, and an optical fiber, said fiber optically coupling said light transmitter and said photodetector.

13. A light transmitter as recited in claim 11, in which said feedback means maintains said characteristic at a local maximum in the light output power versus modulator current characteristic curve.

14. A light transmitter as recited in claim 13 further comprising means for superimposing a modulating current through said modulator section.

15. An optical communications system comprising a light transmitter as recited in claim 14, a photodetector, and an optical fiber, said fiber optically coupling said light transmitter and said photodetector.

16. An optical communications system comprising a light transmitter as recited in claim 13, a photodetector, and an optical fiber, said fiber optically coupling said light transmitter and said photodetector.

17. An optical communications system comprising a light transmitter as recited in claim 2, a photodetector, and an optical fiber, said fiber optically coupling said light transmitter and said photodetector.

18. An optical communications system comprising a light transmitter as recited in claim 1, a photodetector, and an optical fiber, said fiber optically coupling said light transmitter and said photodetector.

* * * * *